United States Patent [19]
Barton et al.

[11] Patent Number: 5,413,687
[45] Date of Patent: May 9, 1995

[54] METHOD FOR METALLIZING FLUOROPOLYMER SUBSTRATES

[75] Inventors: Carlos L. Barton, Brooklyn; Robert B. McGraw, Westport, both of Conn.

[73] Assignee: Rogers Corporation, Rogers, Conn.

[21] Appl. No.: 799,447

[22] Filed: Nov. 27, 1991

[51] Int. Cl.$^6$ .............................................. C23C 14/34
[52] U.S. Cl. ........................ 204/192.14; 204/192.15
[58] Field of Search ................. 204/192.14, 192.15, 204/192.22, 192.3, 298.06

[56] References Cited

U.S. PATENT DOCUMENTS

| | | | |
|---|---|---|---|
| 4,731,156 | 3/1988 | Montmarquet | 204/192.36 X |
| 4,795,660 | 1/1989 | Cooray et al. | 204/192.14 X |
| 4,826,720 | 5/1989 | Wade | 204/192.14 X |
| 4,927,505 | 5/1990 | Sharma et al. | 204/192.3 X |

*Primary Examiner*—Nam X. Nguyen
*Attorney, Agent, or Firm*—Fishman, Dionne & Cantor

[57] ABSTRACT

In accordance with the present invention, it has been discovered that bias sputtering a metal layer (e.g., copper or aluminum) in an atmosphere of a mixture of ammonia and a noble gas leads to dramatically improved adhesion between deposited metal and a fluoropolymer substrate. Preferably, the bias sputtering takes place in an ammonia/argon gas mixture and most preferably in ammonia/argon gas mixture of 5 to 50 volume % ammonia and 50 to 95 volume % argon (most preferably 90/10 argon/ammonia). The use of an ammonia/noble gas atmosphere for bias sputtering is especially well suited for bias sputtering of copper seed layers onto fluoropolymer substrates. In general, the process for depositing a metal layer onto a surface of a fluoropolymer substrate in accordance with the present invention includes the steps of securing the fluoropolymer substrate to an electrically isolated conductive member (e.g. drum) within a vacuum chamber, evacuating the chamber, introducing a flow of a gas mixture of ammonia and a noble gas (preferably argon) through the chamber and bias sputtering a metal (preferably copper) onto the surface of the fluoropolymer substrate while maintaining the flow of the ammonia/noble gas mixture. Preferably, an ammonia plasma pretreatment of the substrate is also used. Also, the drum is preferably rotated during the ammonia plasma pretreatment.

26 Claims, 1 Drawing Sheet

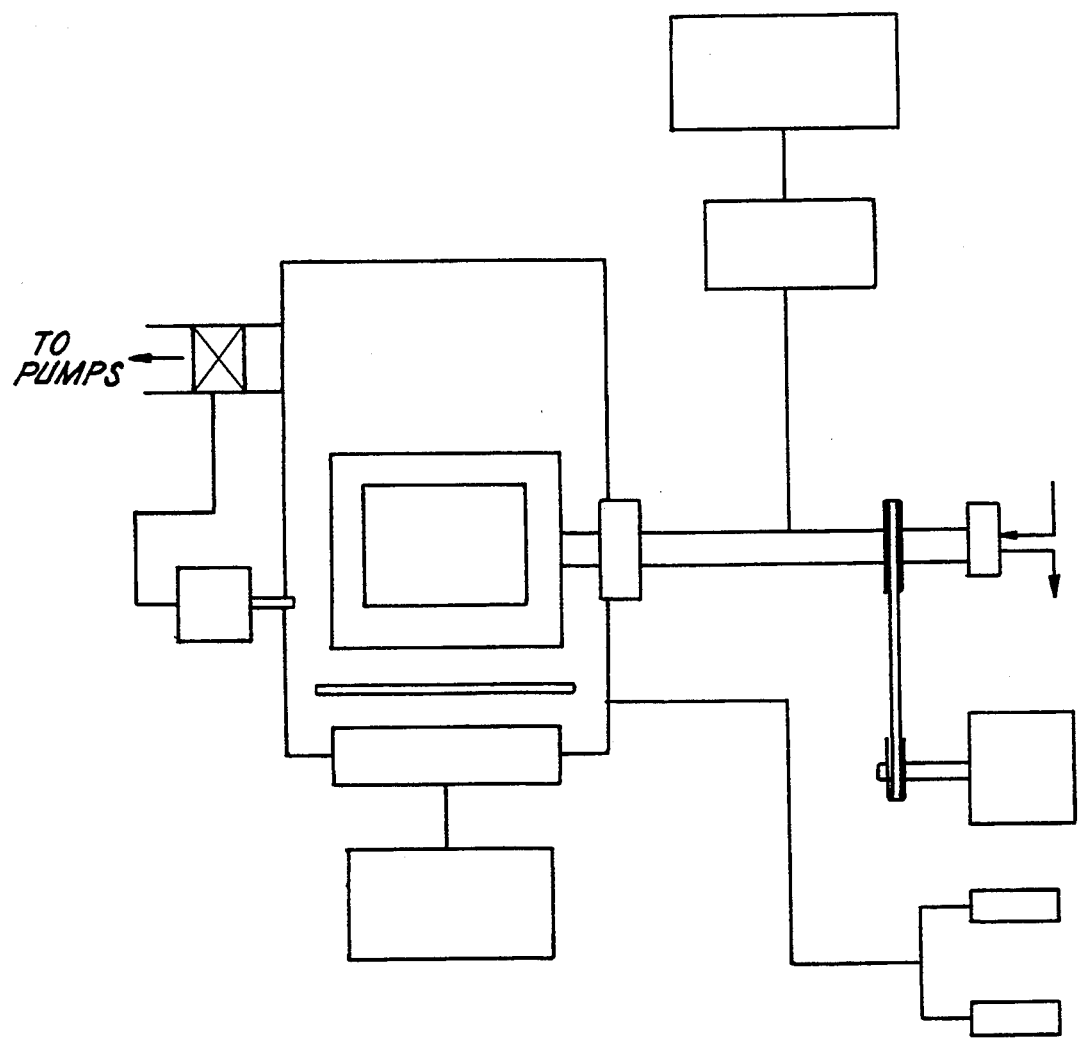

METHOD FOR METALLIZING FLUOROPOLYMER SUBSTRATES

BACKGROUND OF THE INVENTION

This invention relates generally to a method for metallizing fluoropolymer substrates. More particularly, this invention relates to a new and improved method for metallizing fluoropolymer substrates which includes the step of bias sputtering in a mixture of ammonia/noble gas (e.g., argon).

Laminated electrical circuits having metal layers supported on fluoropolymeric substrate layers are known. However, it has proven difficult to produce a metal/fluoropolymer laminate with good adhesion of the metal layer to the polymer substrate. This is especially true when the metal layer is a thin directly deposited layer of less than a few microns. Often, this thin layer (e.g., copper-seed layers) of metal is deposited onto the fluoropolymer substrate by bias sputter deposition in an atmosphere of argon gas.

Several methods for improving the adhesion of a metal layer to a fluoropolymeric substrate are known. In one such method, a fluoropolymeric substrate may be etched using a known sodium/naphthalene pretreatment (commercially available under the tradename TETRA-ETCH by W. L. Gore & Associates) prior to lamination of the metal layer. Unfortunately, this sodium etching process presents several drawbacks in that the etching solution is very corrosive and results in a hazardous waste disposal problem. In addition, this etching process provides no improvement in the adhesion of metal film to extruded perfluorovinyl ether (PFA). This is a serious drawback to sodium/naphthalene pretreatment as PFA is a favored material for use in electrical circuit laminates.

Another method involves electroless metal deposition techniques for depositing the metal layer on the fluoropolymeric substrate, but this method requires the maintenance of wet plating baths and again generates hazardous wastes. High temperature fusion lamination of metal foil to a fluoropolymeric substrate is another process, but this process suffers from problems with regard to maintaining the dimensional stability of the laminate.

Still another method of improving the adhesion between a fluoropolymer substrate and a metal layer is disclosed in U.S. Pat. No. 4,731,156 to Montmarquet. The Montmarquet patent discloses a method wherein wettability of a fluoropolymer surface for later adhesion with a metal foil, substrate or the like is improved by plasma pretreating the fluoropolymer substrate in sealed chamber filled with a mixture of ammonia alone or in combination with oxygen, nitrogen or argon.

While the process of U.S. Pat. No. 4,731,156 leads to some improvement in adhesion, there nevertheless continues to be a need for even better adhesion between fluoropolymer substrates, particularly PFA films, and metallized layers. There also continues to be a need for a method for making a metal/fluoropolymer laminate having high adhesion between the metal and fluoropolymeric layers without generating a hazardous waste stream or compromising the dimensional stability of the laminate.

SUMMARY OF THE INVENTION

The above-discussed and other problems and deficiencies of the prior art are overcome or alleviated by the method of metallizing fluoropolymer substrates of the present invention. In accordance with the present invention, it has been discovered that bias sputtering a metal layer (e.g., copper or aluminum) in an atmosphere of a mixture of ammonia and a noble gas leads to dramatically improved adhesion between the deposited metal and the fluoropolymer substrate. Preferably, the bias sputtering takes place in an ammonia/argon gas mixture and most preferably in ammonia/argon gas mixture of 5 to 50 volume % ammonia and 50 to 95 volume % argon (most preferably 90/10 argon/ammonia). The use of an ammonia/noble gas atmosphere for bias sputtering is especially well suited for bias sputtering of copper seed layers onto fluoropolymer substrates.

In general, the process for depositing a metal layer onto a surface of a fluoropolymer substrate in accordance with the present invention includes the steps of securing the fluoropolymer substrate to an electrically isolated conductive member (e.g. drum) within a vacuum chamber, evacuating the chamber, introducing a flow of a gas mixture of ammonia and a noble gas (preferably argon) through the chamber and bias sputtering a metal (preferably copper) onto the surface of the fluoropolymer substrate while maintaining the flow of the ammonia/noble gas mixture.

The adhesion of the deposited metal onto the fluoropolymer substrate in accordance with the present invention has been found to be improved even further through use of an ammonia plasma pretreatment of the type described in U.S. Pat. No. 4,731,156. (However, it will be appreciated that U.S. Pat. No. 4,731,156 contains no teaching or suggestion for bias sputtering in an ammonia/noble gas mixture as contemplated by the present invention). In addition, it has also been found that rotation of the drum within the vacuum chamber during bias sputtering similarly further improves adhesion between the deposited metal layer and the fluoropolymeric substrate.

The novel method for metallizing fluoropolymer substrates in accordance with the present invention includes many features and advantages. For example, the process of this invention provides adhesion between a copper seed layer and fluoropolymer substrate which is substantially higher than that obtained with either a sodium/naphthalene etch or with electroless copper deposition. In addition, the method of this invention is completely dry and eliminates the need for the corrosive and hazardous sodium/naphthalene etching or electroless metal deposition. Still another important feature of this invention is that strong adhesion can be made between deposited metal and extruded PFA thereby significantly improving the commercial viability of extruded PFA as an electrical circuit laminate. This is a particularly important feature in view of the belief that extruded PFA surfaces cannot be effectively etched with sodium/naphthalene etchant. In still another important feature of this invention, the interface between the deposited metal and fluoropolymeric substrate may be more resistant to the effects of humidity than is the adhesion associated with a sodium etch pretreatment.

The above-discussed and other features and advantages of the present invention will be appreciated and understood by those skilled in the art from the following detailed description and drawing.

BRIEF DESCRIPTION OF THE DRAWINGS

The single FIGURE shows a schematic representation of an apparatus for conducting the process of the present invention.

DETAILED DESCRIPTION OF THE INVENTION

Referring to the FIGURE, the apparatus for use in the process of this invention includes a vacuum chamber 2 having an opening 3 connected to a vacuum pump (not shown) for evacuating chamber 2. A cylindrical deposition drum 4 is rotatably mounted within chamber 2 on shaft 6 and electrical power is supplied to drum 4 through electrically isolated rotatable fitting 8. Shaft 6 and drum 4 are rotated by drive motor 10 through the operation of belt and pulley apparatus 11.

Electrical power is provided to the shaft 6 and deposition drum 4 by radio frequency (RF) power generator 12. A matching network 14 for matching the power supply impedance with that of the plasma is also provided. Preferably, the frequency of the power provided by generator 12 is in the range of about 40 KHz to 40 MHz. Most Preferably, the frequency is 13.56 MHz. The shaft 6 and drum 4 are cooled by a flow of cooling water through conduits 16, 18.

A magnetron sputtering cathode 20 and DC power source 22 are provided on one wall of vacuum chamber 2 and shielded by movable shutter 24. Cathode 20 is located about 10 cm below drum 4.

The fluoropolymer substrate 5 to be metallized is disposed within the vacuum chamber 2 and mechanically fastened to the surface of the deposition drum 4. This fluoropolymer substrate may comprise any suitable filled or unfilled fluoropolymer including, but not limited to polytetrafluoroethylene (PTFE), perfluorovinyl ether (PFA), a copolymer of tetrafluoroethylene (TFE) and PFA, a copolymer of TFE and hexafluoropropylene (FEP), a polychlorotrifluoroethylene (PCTFE) and composites including these resins. Fillers could include microglass, silica, titanium dioxide, carbon fibers, microballons, Kevlar and other ceramic or polymeric fillers. Also, the filler content could be in excess of 60% and the filler particles could be of different sizes (submicron to 100 mm), and shapes (fibers, spheres or irregular particles). The method of the present invention is particularly well suited for use with microwave laminates sold by Rogers Corporation (assignee of the present application) under the trademark RT/DUROID and DUROID. Still other particularly advantageous materials are the fluoropolymeric laminates sold by Rogers Corporation under the trademarks RO2500 and RO2800 and described in U.S. Pat. Nos. 4,335,180, 4,647,508, 4,634,631, 5,061,548 and 5,024,871, all of which are assigned to the assignee hereof.

Preferably, the substrate 5 is heated to remove volatile materials, e.g. moisture, from the substrate. The substrate is heated for about 1 hour at about 250° C. and then immediately transferred into the vacuum chamber 2. Preferably, this bake cycle is done within the vacuum chamber 2 while under vacuum.

After the substrate 5 has been mounted on drum 4, chamber 2 is evacuated, preferably to a pressure below $1 \times 10^{-4}$ Torr, and then a stream of ammonia containing gas (preferably a mixture of $NH_3$ with a noble gas, and most preferably 5 to 100 volume % $NH_3$ and 0 to 95 volume % argon) is allowed to flow through the chamber at a rate of from about 10 to 500, and preferably 250 standard $cm^3$/minute (SCCM) over the substrate surface and the chamber pressure is regulated at 0.05 Torr to about 1.0 Torr (preferably 0.175 Torr) using a capacitance manometer controlled throttle valve 42. Ammonia gas is delivered to chamber 2 through conduit 26 in a metered stream 34 controlled by mass flow controller 30. Deposition drum 4 is then rotated, preferably at a rate of about 1 to about 10 (most preferably 3) revolutions per minute. RF power is supplied to the drum at a power density between 0.1 watts/in$^2$ and 1.0 watts/in$^2$ to plasma pretreat the surface of the substrate for about 5 minutes to about 120 minutes, preferably 20 minutes. This ammonia gas plasma pretreatment and deposition drum rotation constitute important features of the present invention and contribute to the improved adhesion between the deposited metal and fluoropolymer substrate.

The RF power and ammonia gas flow are then discontinued and the chamber is pumped down, preferably to a pressure below about $5 \times 10^{-5}$ Torr. Next, and in accordance with a particularly important and novel feature of this invention, a sputtering gas comprising a mixture of a noble gas and ammonia gas is metered into vacuum chamber 2 by metering system 26 (wherein ammonia gas stream 34 is mixed with a metered stream 32 of noble gas controlled by mass flow controller 28) to achieve a chamber pressure of about 0.001 Torr to about 0.010 Torr. While the noble gas may comprise helium, krypton, argon, neon or xenon, argon is most preferred because of its low cost as well as its preferred mass transfer properties (which are important for bias sputtering). Preferably, the ammonia argon mixture comprises from about 5 to 50 volume percent ammonia ($NH_3$) and from about 50 to 95 volume percent argon, with the most preferred composition being a 90/10 mixture of argon/ammonia.

DC power at a power density of about 10–150 watts/in (preferably 50 watts/in$^2$) is applied to the sputtering cathode 20 and the metal, target (copper or aluminum, preferably copper) is presputtered for a brief period of time, e.g. about 1 minute, with shutter 24 closed, to clean the target. RF power is then applied to the rotating drum 4 and the power is adjusted to produce a bias voltage of about 25 to 250 volts, preferably 125 volts, between ground, i.e. the walls of the chamber 2, and the deposition drum 4.

After presputtering the target, the DC power to the sputtering cathode 20 is controlled to about 10 watts/in cathode surface to about 150 watts/in$^2$ cathode surface and the shutter 24 is opened. Metal (e.g., copper seeds) from the target is then bias sputtered onto the polymer substrate 5 in the argon/ammonia gas mixture for a time period sufficient to allow deposition of a metal layer having a thickness between at least about 100 Angstroms (A) and 1000 A. Preferably, the metal layer has a thickness of about 500 A and then the ammonia component of the gas flow is discontinued.

The RF power to the drum is then discontinued and metal deposition is continued by sputtering copper in an inert gas (argon) atmosphere.

The metal sputtering is continued for a time period sufficient to produce a metal seed layer having a thickness of about 1000 A to about 10,000 A on the polymer substrate.

The chamber is then vented to the atmosphere and then polymer substrate 5 with a strongly adhered metal seed layer is removed from the drum. Additional metal can be plated onto the seed layer using conventional methods, e.g. electrodeposition.

While the mechanism of the present invention is not fully understood, it is clear that the bias sputtering in the ammonia/argon atmosphere is critical to improved adhesion. It is also believed that both the plasma pretreatment and drum rotation features add to this increased adhesion level. It is believed that the plasma pretreatment favorably alters the surface morphology of the fluoropolymer substrate in contrast to the ineffective prior art sodium etch. With respect to rotation of the drum, it is believed that because of the rotation, the metal is being deposited in discrete layers. On each rotation, deposition occurs during approximately 25-30% of rotation. During the remaining 70-75% of the rotation, the deposited metal layer is experiencing low energy (125 volts) ion bombardment by the ammonia/argon gas mixture. It is believed that this alternating deposition and ion bombardment is important to the improved adhesion results.

EXAMPLE 1

Copper layers were deposited on two different fluoropolymer substrates including (1) PTFE film, and (2) an electrical substrate material sold under the trademark RO-2800 by Rogers Corp. and described in U.S. Pat. No. 4,849,284. This deposition of copper was accomplished by:

1) conventional sputtering in an argon atmosphere (control process); and
2) the process of the present invention.

The peel strength of each of the copper layers was then measured. Results are given in Table 1.

TABLE 1

| SUBSTRATE | Peel Strength (pli) | |
|---|---|---|
| | SUBSTRATE METALLIZED BY CONTROL PROCESS | SUBSTRATE METALLIZED BY PROCESS OF PRESENT INVENTION |
| PTFE FILM | Less than 0.5 | 2-3 |
| RO2800 | Less than 2.0 | 4-6 |

As is clear from a review of Table 1, the process of the present invention provides markedly improved adhesion between the sputtered copper and the fluoropolymer substrates as compared to conventional bias sputtering in an argon atmosphere. Also of significance is that during the peel strength testing, the failures occurred within the fluoropolymer substrate (e.g., cohesive failure) as opposed to the interface between the substrate and the metallized layer indicating that the adhesion strength is stronger than the substrate.

EXAMPLE 2

A film of PFA was prepared by extrusion. Metallization of this film was attempted by electroless deposition of copper preceded by the conventional sodium/naphthalene pretreatment. It was discovered that the pretreatment was surprisingly ineffective with this film. That is, the etchant did not attack this film as it does other fluoropolymer films. One of the normal observable results of the corrosive etch is a substantial color on the surface of the material exposed to the etchant. The surface characteristically changes from a light, almost white, color to a dark brown color. With the extruded PFA film, only a very slight color change occurred suggesting that the etchant did not attack the substrate surface in the normal way. Electroless copper metallization of this material resulted in a very poor copper film with many blisters due to poor adhesion and wetting. It is believed that the sodium/naphthalene etchant was ineffective on this film because of the morphology of the polymer surface induced by the extrusion process.

Next, a piece of the extruded film was subjected to:
1. Conventional sputtering in an argon atmosphere without any pretreatments (including any plasma pretreatment in an ammonia containing gas atmosphere).
2. the process of the present invention.

The seedlayers prepared as above were electroplated with additional copper and adhesion was determined by a peel test. The results are given in Table 2 below.

TABLE 2

| | Peel strength |
|---|---|
| Sodium etch + electroless copper | poor film could not test |
| Conventional sputtering (no pretreatments) | less than 2 p.l.i |
| This invention | 7-10 p.l.i |

As in Example 1, the copper/PFA laminate made by this invention also failed cohesively within the fluoropolymer substrate. The results set forth in Table 2 are significant in showing that the present invention is extremely useful for providing adhesion to those surfaces (such as PFA) which are not favorably treated by conventional sodium etching; and thereby allow improved commercial use of such substrates in circuit laminates.

While preferred embodiments have been shown and described, various modifications and substitutions may be made thereto without departing from the spirit and scope of the invention. Accordingly, it is to be understood that the present invention has been described by way of illustrations and not limitations.

What is claimed is:

1. A process for depositing a metal layer onto a surface of a fluoropolymer substrate comprising the steps of:
   placing the fluoropolymer substrate in an atmosphere containing a mixture of ammonia ($NH_3$) gas and a noble gas; and
   bias sputtering a metal layer onto the surface of the fluoropolymer substrate while said fluoropolymer substrate is present within said atmosphere of said ammonia/noble gas mixture.

2. The process of the claim 1 further including the steps of:
   securing the fluoropolymer susbtrate to an electrically isolated, electrically conductive drum within a vacuum chamber;
   evacuating the chamber; and
   introducing a flow of said ammonia gas/noble gas mixture through the chamber.

3. The process of claim 2 further comprising:
   discontinuing the $NH_3$ gas flow;
   discontinuing the bias sputtering;
   sputtering additional metal onto the bias sputtered metal layer while maintaining a flow of an inert gas through the chamber.

4. The process of claim 2 wherein the chamber is evacuated to a pressure of less than about $5 \times 10^{-5}$ Torr.

5. The process of claim 2 wherein the flow of the gas mixture is effective to maintain a pressure of about 0.001 Torr to about 0.010 Torr in the chamber.

6. The process of claim 2 further comprising subjecting the surface of the substrate to an ammonia plasma pretreatment prior to the step of bias sputtering.

7. The process of claim 6 wherein the step of subjecting the surface to an ammonia plasma pretreatment comprises:
maintaining a flow of ammonia containing pretreatment gas through the evacuated chamber; while simultaneously
applying radio frequency electrical power to the electrically conductive drum.

8. The process of claim 7, wherein the chamber is evacuated to a pressure below $1 \times 10^{-4}$ Torr.

9. The process of claim 7 wherein the ammonia containing pretreatment gas comprises from 5% to 100% $NH_3$ and for 0% to 95% of argon.

10. The process of claim 7 wherein the flow of pretreatment gas is maintained at a rate of 50–250 cm$^3$/minute-ft$^2$.

11. The process of claim 7 wherein the flow of ammonia containing pretreatment gas is effective to maintain a pressure between about 0.005 Torr and 1.0 Torr in the chamber.

12. The process of claim 7 wherein the radio frequency power is supplied to the conductive drum at about 0.1 to about 1.0 watts/in$^2$ substrate surface.

13. The process of claim 7 wherein the flow of ammonia containing pretreatment gas and the application of radio frequency electrical power are continued for a time period of about 5 minutes to about 120 minutes.

14. The process of claim 1 wherein:
said noble gas comprises argon gas.

15. The process of claim 14 wherein the gas mixture comprises from about 5 volume percent to about 50 volume percent $NH_3$ and from about 50 volume percent to about 95 volume percent argon.

16. The process of claim 15 wherein the gas mixture comprises:
about 90 volume percent argon and about 10 volume percent $NH_3$.

17. The process of claim 1 wherein a bias voltage of about 25 volts to about 250 volts is maintained during the bias sputtering step.

18. The process of claim 1 wherein said step of bias sputtering is accomplished using a sputtering cathode and wherein DC power of about 10–150 watts/in$^2$ cathode surface is applied to said sputtering cathode during said bias sputtering step.

19. The process of claim 1 wherein the bias sputtering step deposits a metal layer having a thickness greater than about 100 angstroms on the surface of the fluoropolymer substrate.

20. The process of claim 1 further comprising subjecting the surface of the substrate to an ammonia plasma pretreatment prior to the step of bias sputtering.

21. The process of claim 1, wherein the metal is selected from the group consisting of copper or aluminum.

22. The process of claim 21 wherein said fluoropolymer substrate comprises a filled fluoropolymeric composite.

23. The process of claim 22 wherein:
said filled fluoropolymeric composite includes at least one of the fillers selected from the group consisting of microglass, silica, titanium dioxide and carbon fibers.

24. The method of claim 22 wherein:
said filled fluoropolymeric composite includes at least one of the fillers selected from the group consisting of ceramic and polymeric fillers.

25. The process of claim 1 wherein:
said fluoropolymeric substrate includes at least one of the fluoropolymers selected from the group consisting of polytetrafluoroethylene (PTFE), perfluorovinyl ether (PFA), a copolymer of TFE and a copolymer of TFE and hexafluoropropylene (FEP) and a polychlorotrifluoroethylene (PCTFE).

26. The process of claim 1 wherein said fluoropolymer substrate comprises perfluorovinyl ether (PFA).

* * * * *

UNITED STATES PATENT AND TRADEMARK OFFICE
CERTIFICATE OF CORRECTION

PATENT NO. : 5,413,687
DATED : May 9, 1995
INVENTOR(S) : Carlos L. Barton et al

It is certified that error appears in the above-identified patent and that said Letters Patent is hereby corrected as shown below:

Column 4, line 49, delete "10 watts/in" and insert therefor--10 watts/in$^2$

Column 7, line 21, delete "for" and insert therefor--from--.

Signed and Sealed this

Twenty-first Day of December, 1999

Attest:

Q. TODD DICKINSON

Attesting Officer

Acting Commissioner of Patents and Trademarks